United States Patent [19]

Schueller et al.

[11] Patent Number: 4,937,706

[45] Date of Patent: Jun. 26, 1990

[54] GROUND FAULT CURRENT PROTECTIVE DEVICE

[75] Inventors: Pierre Schueller, Grenoble; Gilbert Garnier, Fontaine, both of France

[73] Assignee: Merlin Gerin, France

[21] Appl. No.: 280,178

[22] Filed: Dec. 5, 1988

[30] Foreign Application Priority Data

Dec. 10, 1987 [FR] France ................................ 87 17448

[51] Int. Cl.[5] ................................................ H05K 7/00

[52] U.S. Cl. ...................................... 361/396; 361/393

[58] Field of Search ..................................... 335/18–20; 361/42–45, 115, 335, 356, 357, 392–396, 399

[56] References Cited

U.S. PATENT DOCUMENTS 2,924,688 2/1960 Edmunds ............................ 361/115
3,812,400 5/1974 Gryctko et al. ....................... 335/18
4,568,899 2/1986 May et al. ............................. 335/18
4,794,485 12/1988 Bennett ............................... 361/356

FOREIGN PATENT DOCUMENTS 7637590 12/1976 Fed. Rep. of Germany .
7811589 10/1979 Fed. Rep. of Germany .
2377749 8/1979 France .

*Primary Examiner*—Gregory D. Thompson
*Attorney, Agent, or Firm*—Arnold, White & Durkee

[57] ABSTRACT

A ground fault trip unit of the three-pole type, comprises a fourth conductor passing through the differential transformer. The fourth conductor is connected to terminals located on a different face from that of the terminals of the other three conductors. The same ground fault trip unit can be associated with a three-pole breaking device, in which case the fourth conductor is not used, and with a four-pole device whose fourth pole is connected to the fourth conductor of the ground fault trip unit.

7 Claims, 3 Drawing Sheets

GROUND FAULT CURRENT PROTECTIVE DEVICE

BACKGROUND OF THE INVENTION

The invention relates to a molded case ground fault trip unit capable of being coupled to a molded case of a breaking unit to form a ground fault current protective device. The breaking unit has, aligned on one of its faces, external terminals, and on the opposite face internal connection terminals to the ground fault trip unit. The terminals are connected two by two by conductors in which the breaking contacts of the breaking unit are inserted. The ground fault trip unit includes comprising a differential transformer through which several active conductors pass constituting the primary windings of the transformer, whose secondary winding electromechanically controls opening of the breaking contacts when a ground fault occurs.

A ground fault trip unit of the kind mentioned, associated with a breaking device, notably an electrical circuit breaker or switch, gives this device differential protection properties. The advantages of reduced manufacturing and storage costs of modular systems of this kind are well-known, and they are all the more considerable as the number of standard elements is limited.

The object of the invention is to provide a ground fault trip unit which can be used in different combinations with standard switches or circuit breakers to achieve three-pole or four-pole differential protection devices.

SUMMARY OF THE INVENTION

The ground fault trip unit according to the invention is characterized in that the ground fault trip unit comprises four active conductors each having a first end and a second end. The the first ends of three active conductors are connected to three aligned external terminals of the ground fault trip unit. The the second ends of said three active conductors are aligned on a first face of the ground fault trip unit case to enable connection to be made to said internal terminals of the breaking unit. The first and second ends of the fourth conductor are connected to terminals located on a second face of the ground fault trip unit case different from the first face.

The ground fault trip unit is of the three-pole type, but it comprises a fourth active conductor passing through the differential transformer and connected to separate terminals from the terminals of the other three conductors. This ground fault trip unit can be associated with a breaking unit, notably a molded case circuit breaker or switch of the three-pole type, the cases naturally having conjugate shapes and assembly means enabling the fitter or the user to fix one of these units onto the other. This device can be used in a three-pole installation whose neutral conductor is not distributed, and in this case the fourth active conductor of the ground fault trip unit is not used. The extra cost due to this fourth conductor fitted when the ground fault trip unit is manufactured is minimal, and is amply counterbalanced by the possibility of using the same unit for other combinations. The same device is suitable for a three-phase installation with distributed but unbroken neutral. The neutral conductor is in this case connected to the fourth conductor of the ground fault trip unit, in such a way that the differential transformer performs summing of the currents flowing in the four conductors.

To achieve a four-pole device with breaking of the neutral conductor, it is merely necessary to associate the ground fault trip unit according to the invention with a four-pole breaking device connecting the fourth pole of the breaking device to the fourth conductor of the ground fault trip unit. The size of the four-pole breaking device is naturally larger than that of the ground fault trip unit and it is advantageous to house the connecting conductors of the fourth conductor in an auxiliary unit, of conjugate shape, to preserve a harmonious external appearance. Mechanical assembly and electrical connection of the two units can be accomplished by any operative means, for example by clip-on systems and connection terminals. The invention is described hereinafter in its preferred application of a ground fault trip unit coupled to the face of the breaking device bearing the connection terminals of the circuit breaker or switch, but it is clear that any other arrangement is conceivable, the advantage of a standard ground fault trip unit enabling it to be associated with a three-pole or a four-pole breaking device being preserved.

The ground fault trip unit can comprise input and output terminals or preferably input conductors output from the trip unit case and capable of being connected to the terminals of the breaking device when the latter is assembled to the ground fault trip unit.

BRIEF DESCRIPTION OF THE DRAWINGS

Other advantages and features will become more clearly apparent from the following description of an illustrative embodiment of the invention, given as a non-restrictive example only and represented in the accompanying drawings, in which.

DESCRIPTION OF THE PREFERRED EMBODIMENT

Figure 1:
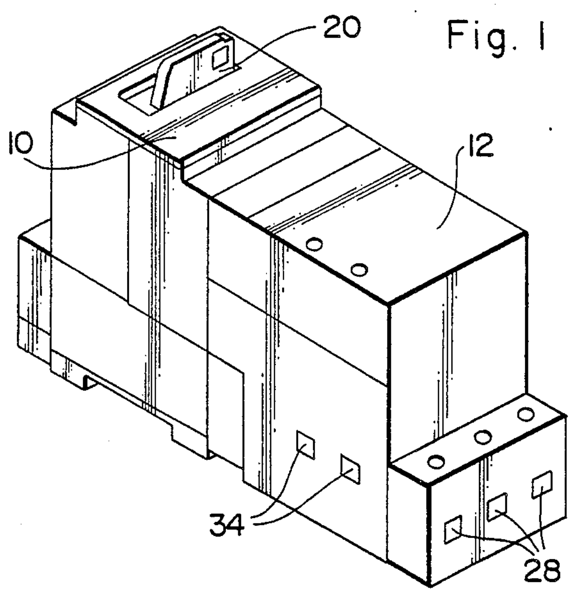
FIG. 1 is a perspective view of a three-pole protective device according to the invention.
Figure 4:
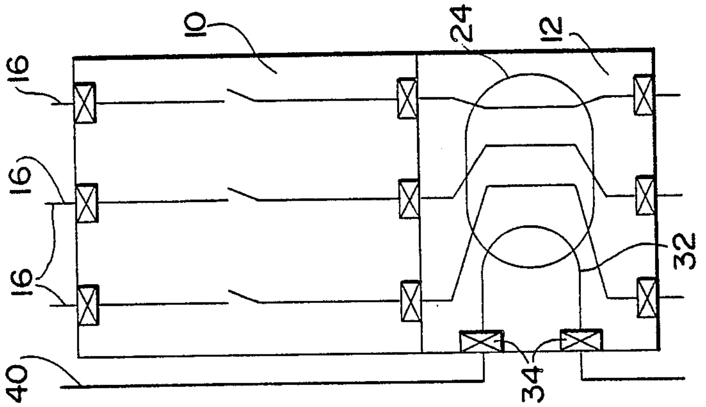
FIG. 4 is a similar view to that of FIG. 3, showing the same device used in an installation having an unbroken neutral.
Figure 3:
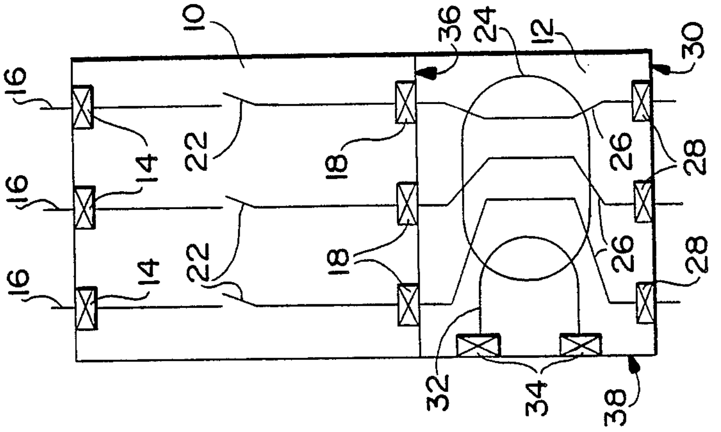
FIG. 3 shows the layout diagram of the three-pole device according to FIG. 1.

In FIGS. 1, 3 and 4, a molded case three-pole electrical circuit breaker 10 is associated with a ground fault trip unit 12, the shapes of the adjoining faces in two units 10, 12 being conjugate. The circuit breaker 10 can be a switch or any other breaking device, having input terminals 14 for connection of the external conductors 16 and output terminals 18, the latter being located on the face receiving the adjoining ground fault trip unit 12 to enable the two units 10, 12 to be connected internally. The circuit breaker 10 can comprise a manual operating handle 20 and in the usual way overload or shortcircuit detectors causing automatic opening of the contacts 22 inserted in the conductors connecting the input terminals 14 to the output terminals 18. The circuit breaker 10 is a standard equipment unit generally used independently from a ground fault unit 12 to provide protection of an installation.

The ground fault trip unit 12 houses a toroid-shaped differential transformer 24 which has passing through it on the one hand three conductors 26, the ends of which are connected to external terminals 28 aligned on one of the faces 30 of the trip unit 12, and on the other hand a fourth conductor 32 both ends of which are connected to two terminals 34. The opposite ends of the three conductors 26 pass through the face 36 adjoining the circuit breaker unit 10 to be connected to the internal terminals 18 of the circuit breaker unit 10. The face 30 bearing the external terminals 28 is opposite the adjoining face 36 and these terminals 28 and the ends of the conductors 26 connected to the terminals 18 of the circuit breaker unit are regularly spaced apart and aligned along these faces 30, 36, in a well-known manner. The two terminals 34 of the fourth conductor 32 are located on a free side face 38 of the ground fault trip unit 12. The differential transformer 24 comprises a secondary winding (not shown) which controls automatic opening of the contacts 22 by means of a relay and a mechanical connection between the two units 10, 12, when a ground fault current is detected. Differential tripping systems of this kind are well-known to those skilled in the art and it is not necessary to describe them in detail here.

The ground fault trip unit of the invention is implemented as follows :

To achieve a three-pole protective device, the ground fault trip unit 12 is assembled to the circuit breaker unit 10, for example by simply clipping it on, the face 36 through which the ends of the active conductors 26 pass being adjoined to the case of the circuit breaker unit 10 and the ends of these three active conductors 26 being electrically connected to the internal terminals 18 of the circuit breaker unit 10. The fourth conductor 32 is not used and it can easily be seen that the differential transformer 24 performs summing of the currents flowing through the contacts 22. The presence of the fourth conductor 32 does not increase the overall dimensions of the trip unit 12. The three-pole device represented in FIG. 3 is suitable for example for protecting a three-phase installation without a neutral conductor.

The same protective device can be used for a three-phase installation with unbroken neutral, represented schematically in FIG. 4. The neutral conductor 40 is connected to the terminals 34, in such a way that the fourth conductor 32 has the neutral current flowing through it and that the differential transformer 24 performs summing of the phase current 16 and the neutral current 40.

Figure 2:
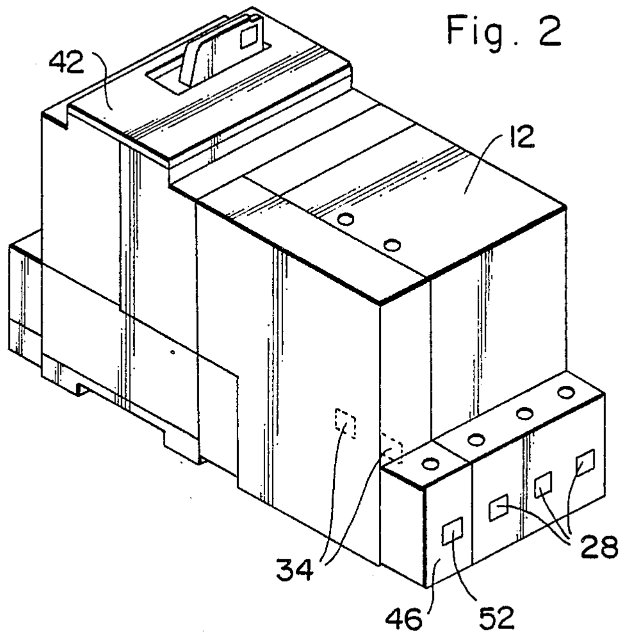
FIG. 2 is a similar view to that of FIG. 1, illustrating a four-pole protective device according to the invention.
Figure 5:
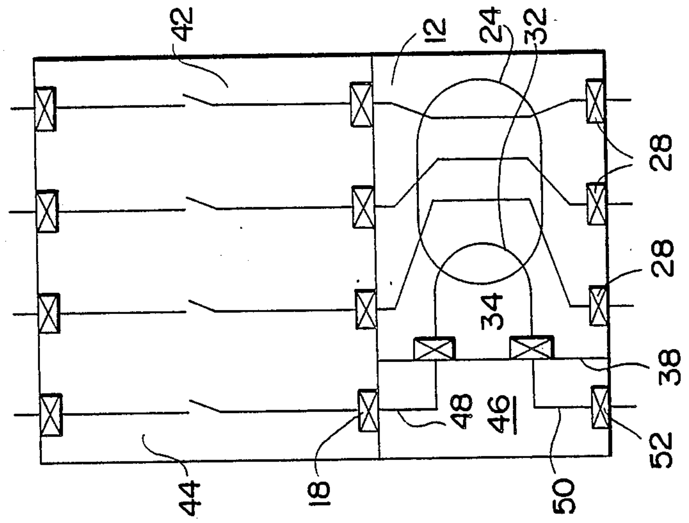
FIG. 5 is a similar view to that of FIG. 3, showing a four-pole device according to FIG. 2.

Referring more particularly to FIGS. 2 and 5, it can be seen that the ground fault trip unit 12 according to the invention is assembled to a four-pole circuit breaker unit 42. An auxiliary unit 46 is coupled to the face 38 of the trip unit 12 bearing the terminals 34, this auxiliary unit 46 being disposed facing the fourth pole 44 of the circuit breaker unit 42. The auxiliary unit 46 houses a conductor 48 connecting the internal terminal 18 of the fourth pole 44 to the terminal 34 of the fourth conductor 32 of the trip unit 12, and a conductor 50 connecting the other terminal 34 to an output terminal 52 aligned with the terminals 28 of the trip unit 12. It can easily be seen that the differential transformer 24 has passing through it the four conductors of the four-pole circuit breaker 42 and provides differential protection of the four-pole installation protected by the circuit breaker 42. The outline of the auxiliary unit 46 naturally corresponds to that of the trip unit 12 and of the circuit breaker unit 10. It should be noted that by associating an auxiliary unit 46 of negligible cost to the ground fault trip unit 12 according to the invention, it is possible to use this standard ground fault trip unit to provide protection of a four-pole installation.

Figure 6:
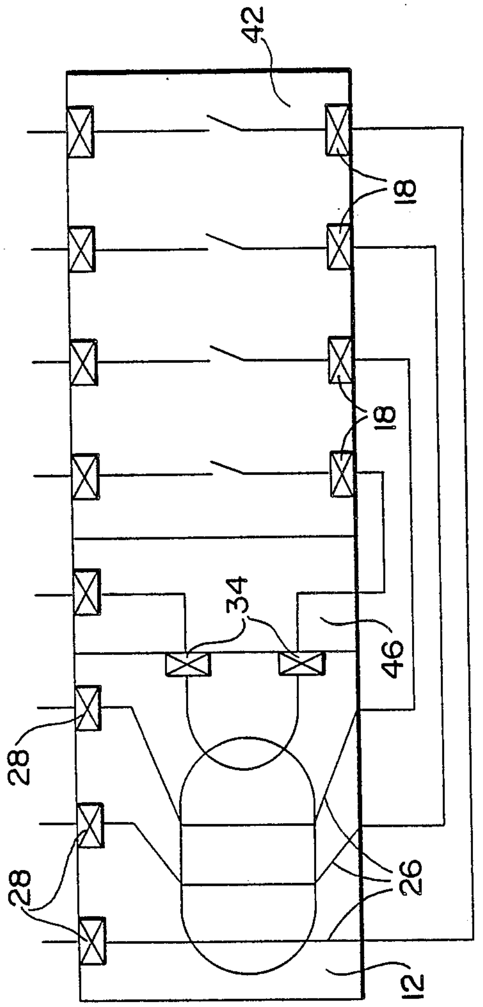
FIG. 6 illustrates an alternative embodiment of the device according to FIG. 5.

In the examples given above, the fourth conductor 32 was associated with a neutral conductor, but it is clear that any other arrangement can be used depending on the type of installation. The layout of the units 10, 12 can also be different and FIG. 6 represents an example of a four-pole device with a circuit breaker unit 42, and a ground fault trip unit 12, located side by side, with the auxiliary unit 46 interposed. This arrangement, usual in miniature modular systems, enables the units 12, 42, 46 to be clipped onto a profiled support rail. The three conductors 26 are elongated to allow external connection to the aligned terminals 18 of the circuit breaker unit 42. In this embodiment, the terminals 28 of the ground fault trip unit 12 may be located on the output face of the three conductors 26 so that the output takes place on the opposite face from the input in the usual way. Other arrangements, notably of the auxiliary unit 46, are conceivable and the invention is naturally in no way limited to the embodiment more particularly described herein.

We claim:

1. A ground fault current protective device comprising a molded case ground fault trip unit (12) having a first (36) and a second (38) face, a molded case breaking unit (10,42) capable of being coupled to the trip unit and having breaking contacts (22) and a first and a second face, said breaking unit (10,42) having, aligned on said first face, external terminals (14) and on said second face internal connection terminals (18) in which said breaking contacts (22) of the breaking unit are inserted, said ground fault trip unit (12) comprising a differential transformer (24) having primary windings constituted by several active conductors (26,32) passing through the transformer and controlling the opening of the breaking contacts when a ground fault occurs, wherein the ground fault trip unit (12) comprises four active conductors (26,32) each having a first end and a second end, the first end of three active conductors (26) being connected to three aligned external terminals (28) of the ground fault trip unit (12), the second end of said three active conductors (26) being aligned on said first face (36) of the ground fault trip unit (12) to enable connection to be made to said internal terminals (18) of the breaking unit (10,42) and the first and second ends of the fourth conductor (32) being connected to terminals (34) located on said second face (38) of the ground fault trip unit (12).

2. The ground fault current protective device of claim 1, wherein said first face (36) of the trip unit (12) is arranged to be adjoined to the face bearing the internal terminals (18) of the breaking unit (10,42) and wherein in the adjoined position of the units (12;10,42), said second end of the three active conductors (26) faces said internal terminals to enable electrical connection.

3. The ground fault current protective device of claim 1, wherein the parallelepipedic-shaped case of the ground fault trip unit (12) presents four side faces and wherein said three external terminals (28) and said second end of said three active conductors (26) are aligned respectively on an opposing two of the four side faces, the ends of the fourth conductor (32) being on one (38) of the other two of the four side faces.

4. The ground fault current protective device of claim 1, wherein the width of said first face (36) of the ground fault trip unit (12) is equal to that of said second face, bearing the internal terminals (18), of a three-pole breaking unit (10).

5. The ground fault current protective device of claim 1, wherein said ground fault trip unit (12) is adjoined to a three-pole breaking unit (10), said fourth conductor (32) not being used.

6. The ground fault current protective device of claim 1, wherein said ground fault trip unit (12) is adjoined to a three-pole breaking unit (10), a neutral conductor being connected to said fourth conductor (32) to insert said fourth conductor in a neutral circuit.

7. The ground fault current protective device of claim 1, wherein said ground fault trip unit (12) is adjoined to a four-pole breaking unit (42) and wherein an auxiliary connection unit (46) facing the fourth pole (44) of the breaking unit is adjoined to said second face (38) of the ground fault trip unit (12) bearing the terminals (34) of the fourth conductor (32), and wherein connecting conductors, housed in the auxiliary unit, provide connection of the first end of the fourth conductor to one of said internal connection terminals of said breaking unit and connection of the second end of the fourth conductor to an external terminal (52) of the auxiliary unit (44) aligned with one of said three external terminals (28) of the ground fault trip unit.

* * * * *